United States Patent
Chi

(10) Patent No.: US 9,012,286 B2
(45) Date of Patent: Apr. 21, 2015

(54) METHODS OF FORMING FINFET SEMICONDUCTOR DEVICES SO AS TO TUNE THE THRESHOLD VOLTAGE OF SUCH DEVICES

(75) Inventor: Min-Hwa Chi, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 4 days.

(21) Appl. No.: 13/445,428

(22) Filed: Apr. 12, 2012

(65) Prior Publication Data
US 2013/0270641 A1    Oct. 17, 2013

(51) Int. Cl.
H01L 21/336    (2006.01)
H01L 21/8238   (2006.01)
H01L 29/10     (2006.01)

(52) U.S. Cl.
CPC .... *H01L 21/823821* (2013.01); *H01L 29/1054* (2013.01)

(58) Field of Classification Search
None
See application file for complete search history.

(56) References Cited

U.S. PATENT DOCUMENTS

| | | |
|---|---|---|
| 7,655,534 B2 | 2/2010 | Sheen et al. |
| 2005/0282342 A1* | 12/2005 | Adan .............. 438/294 |
| 2008/0265321 A1* | 10/2008 | Yu et al. .......... 257/344 |
| 2010/0219485 A1* | 9/2010 | Chong et al. ..... 257/369 |
| 2011/0101421 A1 | 5/2011 | Xu |
| 2011/0108920 A1* | 5/2011 | Basker et al. .... 257/351 |
| 2011/0175166 A1* | 7/2011 | Bedell et al. .... 257/351 |
| 2011/0210404 A1* | 9/2011 | Su et al. ......... 257/401 |
| 2013/0093026 A1* | 4/2013 | Wann et al. ...... 257/401 |

* cited by examiner

*Primary Examiner* — Davienne Monbleau
*Assistant Examiner* — Shaka White
(74) *Attorney, Agent, or Firm* — Amerson Law Firm, PLLC

(57) ABSTRACT

Disclosed herein are various methods of forming FinFET semiconductor devices so as to tune the threshold voltage of such devices. In one example, the method includes forming a plurality of spaced-apart trenches in a semiconducting substrate to define at least one fin (or fins) for the device, prior to forming a gate structure above the fin (or fins), performing a first epitaxial growth process to grow a first semiconductor material on exposed portions of the fin (or fins) and forming the gate structure above the first semiconductor material on the fin (or fins).

36 Claims, 9 Drawing Sheets

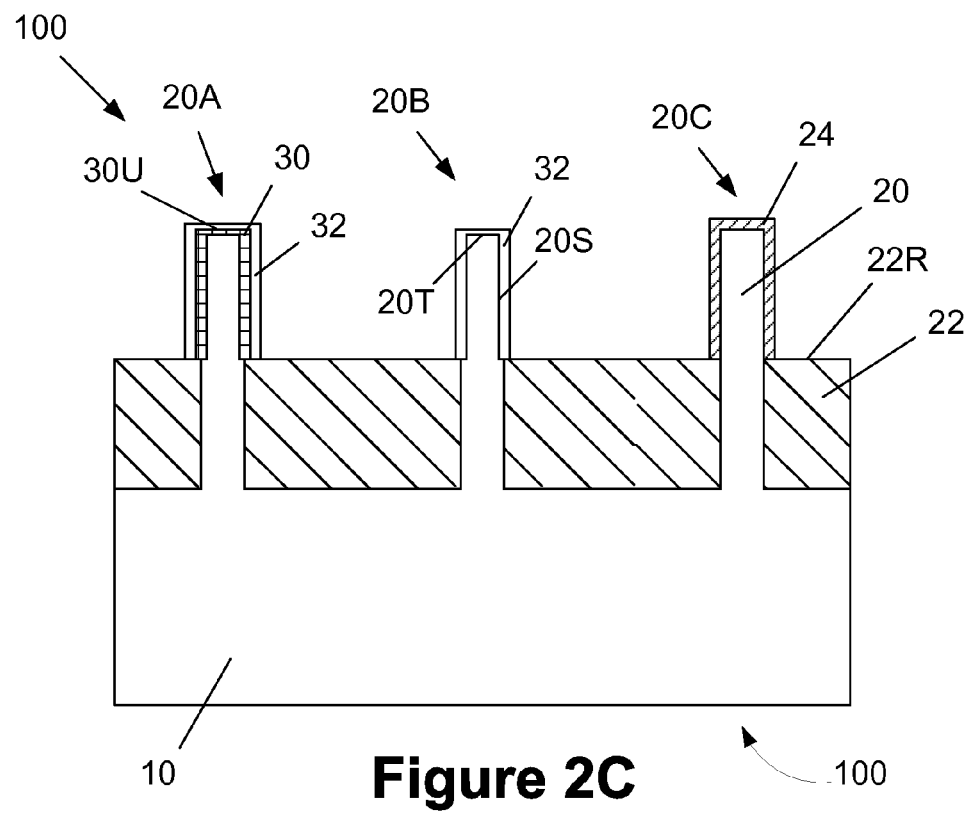
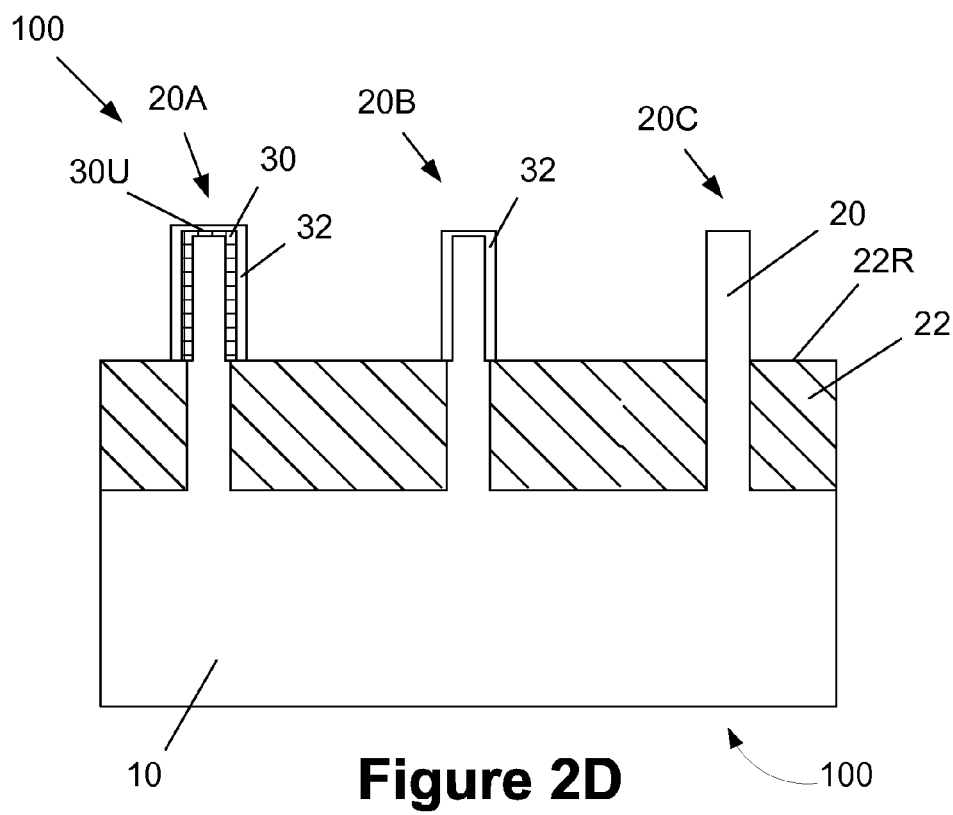

METHODS OF FORMING FINFET SEMICONDUCTOR DEVICES SO AS TO TUNE THE THRESHOLD VOLTAGE OF SUCH DEVICES

BACKGROUND OF THE INVENTION

1. Field of the Invention

Generally, the present disclosure relates to the manufacture of sophisticated semiconductor devices, and, more specifically, to various methods of forming FinFET semiconductor devices so as to tune the threshold voltage of such devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by the voltage applied to the gate electrode. If the voltage applied to the gate electrode is less than the threshold voltage of the transistor, then there is no conductive channel formed and the FET is "off", i.e., there is no current flow (ignoring undesirable leakage currents which are relatively small). However, when a voltage is applied to the gate electrode that exceeds the threshold voltage ("$V_t$") of the device, the channel region becomes conductive, and electrical current is permitted to flow between the source region and the drain region through the conductive channel region. The threshold voltage of transistor devices is a very important characteristic of such devices. There are two types of FETs (i.e., N-channel and P-channel) as defined by the formation of conductive channels of electrons (N-type) and holes (P-type). The conductive channels are electrostatically induced when the gate bias is higher (N-type) or lower (P-type) voltage than the source region. The source and the drain regions are doped N-type and P-type for N-channel and P-channel FETs, respectively. A digital circuit typically includes both N-type and P-type MOSFETs and is generally referred to as Complementary-MOSFET (or CMOS). A typical inverter of logic includes one N-channel and one P-channel MOSFET connected in series.

To improve the operating speed of FETs, and to increase the density of FETs on an integrated circuit device, device designers have greatly reduced the physical size of FETs over the years. The well-known "Moore's law" of scaling guides the semiconductor industry to advance one CMOS technology node by doubling the density of FETs about every two years. More specifically, the channel length of FETs has been significantly decreased, e.g., about a 70% linear scaling at every technology node, which has resulted in improving the switching speed of FETs. However, decreasing the channel length of a FET also decreases the distance between the source region and the drain region and the control of the electrical potential of the channel from the gate. In some cases, this decrease in the gate length and the separation between the source and the drain makes it difficult to efficiently inhibit the electrical potential of the source region and the channel from being adversely affected by the electrical potential of the drain (e.g., the threshold voltage ("$V_t$") decreases and leakage current increases with smaller channel length). This is sometimes referred to as a so-called short channel effect, wherein the characteristic of the FET as an active switch is degraded.

In contrast to a FET, which has a planar structure, there are so-called three-dimensional ("3D") devices, such as an illustrative FinFET device, which is a 3D structure. More specifically, in a FinFET, a generally vertically positioned fin-shaped active area is formed and a gate structure (including a gate dielectric and a gate electrode) encloses both sides and an upper surface of the fin-shaped active area to form a tri-gate structure so as to use a channel having a 3D structure instead of a planar structure. In some cases, an insulating cap layer, e.g., silicon nitride, silicon dioxide, etc., that is typically thicker than the gate insulation layer is positioned at the top of the fin and the FinFET device only has a dual-gate structure. Unlike a planar FET, in a FinFET device, a thin channel region (or fin) is formed perpendicular to a surface of the semiconducting substrate so as to reduce the physical foot print of the semiconductor device. The potential of the vertical fin (or channel) is controlled by the tri-gate surrounding both sides and the top of the fin, thus the on-off characteristics of the devices is better controlled by the gate voltage than the planar FET and thus greatly reduce the "short-channel-effects." As with planar FETs, there are N-channel and P-channel FinFETs wherein a conductive channel is electrostatically induced along the sidewalls and top surface of the fin when the FinFET device is turned "on."

The sophistication and complexity of integrated circuit products has increased greatly in recent years. Many integrated circuit products are based upon the concept of system-on-chip (SOC) integrated circuits wherein a single chip may contain different circuit blocks that are adapted to perform different tasks. Customers continue to demand high-performance integrated circuit products that exhibit greater performance and greater flexibility in terms of product design and capabilities. Thus, there is a need for FinFET devices, both P-type and N-type devices (in CMOS circuits), that have variations in the threshold voltages ("$V_t$") of such devices, e.g., high, medium and low threshold voltages (for both N-type and P-type FinFETs), to give device designers greater flexibility and options in designing complex integrated circuits. There have been various attempts in the prior art to produce FinFET devices in such a manner that the $V_t$ of the devices may be varied or tuned by various process steps. One prior art technique involved attempting to tune the threshold voltage of such devices by selectively controlling the amount of dopant in the channel region, i.e., by performing various ion implantation processes whereby varying doses of dopant were implanted in selective areas. Another prior art technique involves producing a device with multiple fins wherein the fins have different fin widths, wherein the wider fins can include more dopants in the channel region which increases the $V_t$ of the device for the same ion implantation step. Other prior art techniques involve the selective change of the work-function of a metal gate stack by implanting arsenic into the metal gate stack, adjusting the thickness of metal layers, adding capping layers to gates, etc. However, these processes have not been readily adopted because of a variety of reasons. For example, the aforementioned selective ion implantation processes may tend to damage the metal gate stacks, the gate dielectric and/or the channel region. Some of the other prior art attempts tend to greatly increase processing complexity by extra process steps of masking, etching, thin film deposition, chemical mechanical polishing (CMP), annealing, etc. Additionally, some of the prior art techniques that were based on varying ion implantation processes and/or fin width adjustments resulted in devices having very large variations in threshold voltage ($V_t$) when the devices had very small gate lengths and narrow gate lengths.

The present disclosure is directed to various methods of forming FinFET semiconductor devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming FinFET devices so as to tune the threshold voltage ($V_t$) of such FinFET devices. In one example, the method includes forming a plurality of spaced-apart trenches in a semiconducting substrate to define at least one fin (or fins) for the device, prior to forming a gate structure above the fin (or fins), performing a first epitaxial growth process to grow a first semiconductor material on exposed portions of the fin (or fins) and forming the gate structure above the first semiconductor material on the fin (or fins). In further more detailed embodiments, various methods disclosed herein may involve forming a second semiconductor material on the fin (or fins) with the first semiconductor material prior to forming the gate structure. In some cases, the first and/or second (or further) semiconductor material(s) may extend for the entire axial length of the fin (or fins). In cases where the device is comprised of multiple fins, some or all of the fins may be provided with one or more additional semiconductor materials.

Another illustrative method disclosed herein involves forming a plurality of spaced-apart trenches in a semiconducting substrate that define a plurality of fins for the device, forming a hard mask layer that covers exposed portions of at least one of the plurality of fins but leaves at least one other of the plurality of fins exposed for further processing and performing a first epitaxial growth process through the hard mask layer to grow a first semiconductor material on the at least one other of the plurality of fins that was exposed for further processing. Thus, the first epitaxial growth process may be performed selectively on those fins not covered by the hard mask layer. Similarly, the epitaxial growth process can be repeated for selective growth of the second, third (or more) materials on fins in various meaningful combinations and in sequences. Thus, for example, in system-on-chip (SOC) where the device is comprised of various circuit blocks, some or all of the fins may be used with one or more additional semiconductor materials for each circuit block (for various operations, e.g., different clock rate, $V_{cc}$, etc.).

The present disclosure is also directed to various novel FinFET devices. In one illustrative example, the device includes a fin comprised of an original semiconducting substrate, a first semiconductor layer positioned on at least sidewalls of the fin, a gate insulation layer positioned above the first semiconductor layer and a gate electrode positioned above the gate insulation layer.

In another example, the present disclosure is directed to a FinFET device that includes at least a first fin and a second fin, each of which are comprised of an original semiconducting substrate, a first semiconductor layer positioned on at least sidewalls of the first and second fins, a second semiconductor layer positioned above the first semiconductor layer on the second fin, a gate insulation layer positioned above the first semiconductor layer of the first fin and above the first semiconductor layer and the second semiconductor layer of the second fin and a gate electrode positioned above the gate insulation layer.

In another example, the present disclosure is directed to a FinFET device that includes at least a first fin and a second fin, each of which are comprised of an original semiconducting substrate, a first semiconductor layer positioned on at least sidewalls of the first and second fins, a second semiconductor layer positioned above the first semiconductor layer on the second fin, a gate insulation layer positioned above the first semiconductor layer of the first fin and above the first semiconductor layer and the second semiconductor layer of the second fin and a gate electrode positioned above the gate insulation layer.

BRIEF DESCRIPTION OF THE DRAWINGS

The disclosure may be understood by reference to the following description taken in conjunction with the accompanying drawings, in which like reference numerals identify like elements, and in which:

FIGS. 2A-2E depict yet another illustrative method disclosed herein for adjusting the threshold voltage of an illustrative FinFET device.

Figure 1A:
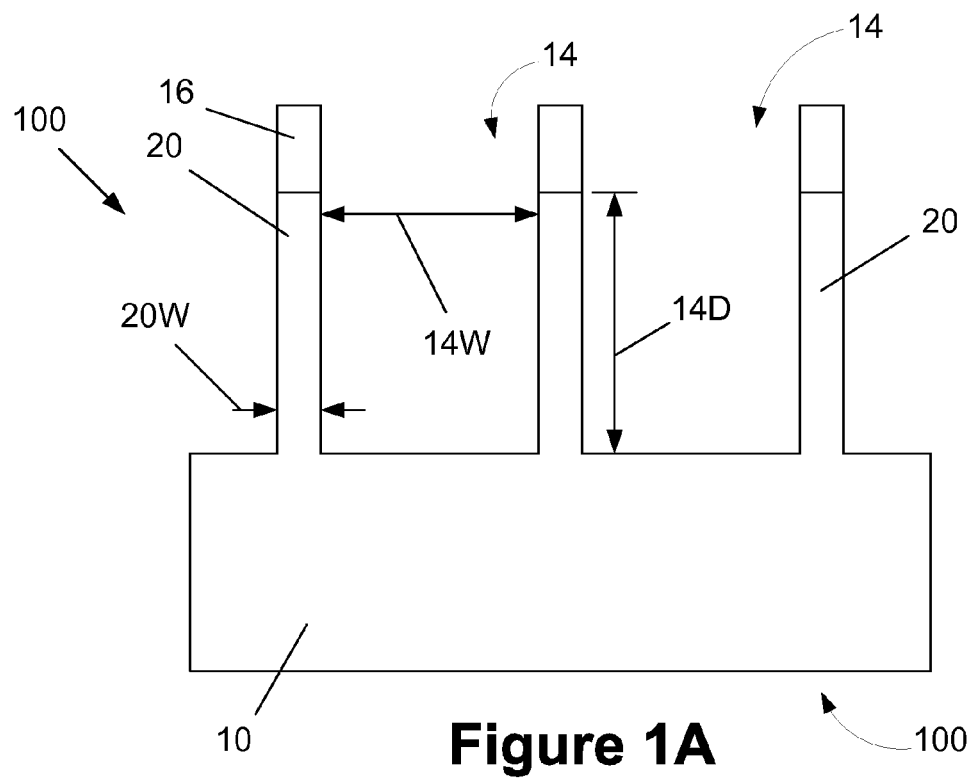
FIGS. 1A-1I depict one illustrative method disclosed herein for adjusting the threshold voltage of an illustrative FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming FinFET semiconductor devices so as to tune the threshold voltage ($V_t$) of such devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIG. 1A is a simplified view of an illustrative FinFET semiconductor device 100 at an early stage of manufacturing that is formed above a semiconducting substrate 10. The substrate 10 may have a variety of configurations, such as the depicted bulk silicon configuration. The substrate 10 may be made of silicon or it may be made of materials other than silicon. The substrate may also take the form of a silicon-on-insulator (SOI) substrate that is comprised of a bulk substrate, a buried insulation layer (also referred to as a BOX layer) and an active layer positioned above the box layer. In such an embodiment, the device 100 would be formed in the active layer. Thus, the terms substrate or semiconducting substrate as used herein and in the appended claims should not be considered as limited to any particular configuration or material.

At the point of fabrication depicted in FIG. 1A, a patterned mask layer 16, such as a patterned hard mask layer, has been formed above the substrate 10 using known photolithography and etching techniques. The patterned mask layer 16 is intended to be representative in nature as it could be comprised of a variety of materials, such as, for example, a photoresist material, silicon nitride, silicon oxynitride, silicon dioxide, etc. Moreover, the patterned mask layer 16 could be comprised of multiple layers of material, such as, for example, a pad oxide layer (not shown) that is formed on the substrate 10 and a silicon nitride layer (not shown) that is formed on the pad oxide layer. Thus, the particular form and composition of the patterned mask layer 16 and the manner in which it is made should not be considered a limitation of the present invention. In the case where the patterned mask layer 16 is comprised of one or more hard mask layers, such layers may be formed by performing a variety of known processing techniques, such as a furnace oxidation process, a chemical vapor deposition (CVD) process, an atomic layer deposition (ALD) process, an epitaxial deposition process (EPI), or plasma enhanced versions of such processes, and the thickness of such a layer(s) may vary depending upon the particular application. In one illustrative embodiment, the patterned mask layer 16 is a stack of hard mask layers of silicon dioxide and silicon nitride that is initially formed by performing a thermal oxidation process and a CVD process and thereafter patterned using known sidewall image transfer techniques and/or photolithographic techniques combined with performing known etching techniques.

With continuing reference to FIG. 1A, an etching process, such as a dry or wet etching process, is performed on the substrate 10 through the patterned mask layer 16 to form a plurality of trenches 14. This etching process results in the definition of a plurality of fins 20. The overall size, shape and configuration of the trenches 14 and fins 20 may vary depending on the particular application. The depth 14D and width 14W of the trenches 14 may vary depending upon the particular application. In one illustrative embodiment, based on current technology, the depth 14D of the trenches 14 may range from approximately 30-250 nm and the width 14W of the trenches 14 may range from about 30-250 nm. In some embodiments, the fins 20 may have a width 20W within the range of about 10-20 nm. In the illustrative example depicted herein, the trenches 14 and fins 20 are all of a substantially uniform size and shape. However, such uniformity in the size and shape of the trenches 14 and the fins 20 is not required to practice at least some aspects of the inventions disclosed herein. In the example depicted herein, the trenches 14 are formed by performing an anisotropic etching process that results in the trenches 14 having a schematically depicted, generally rectangular configuration. In an actual real-world device, the sidewalls of the trenches 14 may be somewhat inwardly tapered, although that configuration is not depicted in the drawings. In some cases, the trenches 14 may have a reentrant profile near the bottom of the trenches 14. To the extent the trenches 14 are formed by performing a wet etching process, the trenches 14 may tend to have a more rounded configuration or non-linear configuration as compared to the generally rectangular configuration of the trenches 14 that are formed by performing an anisotropic etching process. Thus, the size and configuration of the trenches 14, and the manner in which they are made, should not be considered a limitation of the present invention. For ease of disclosure, only the substantially rectangular trenches 14 will be depicted in subsequent drawings.

Figure 1B:
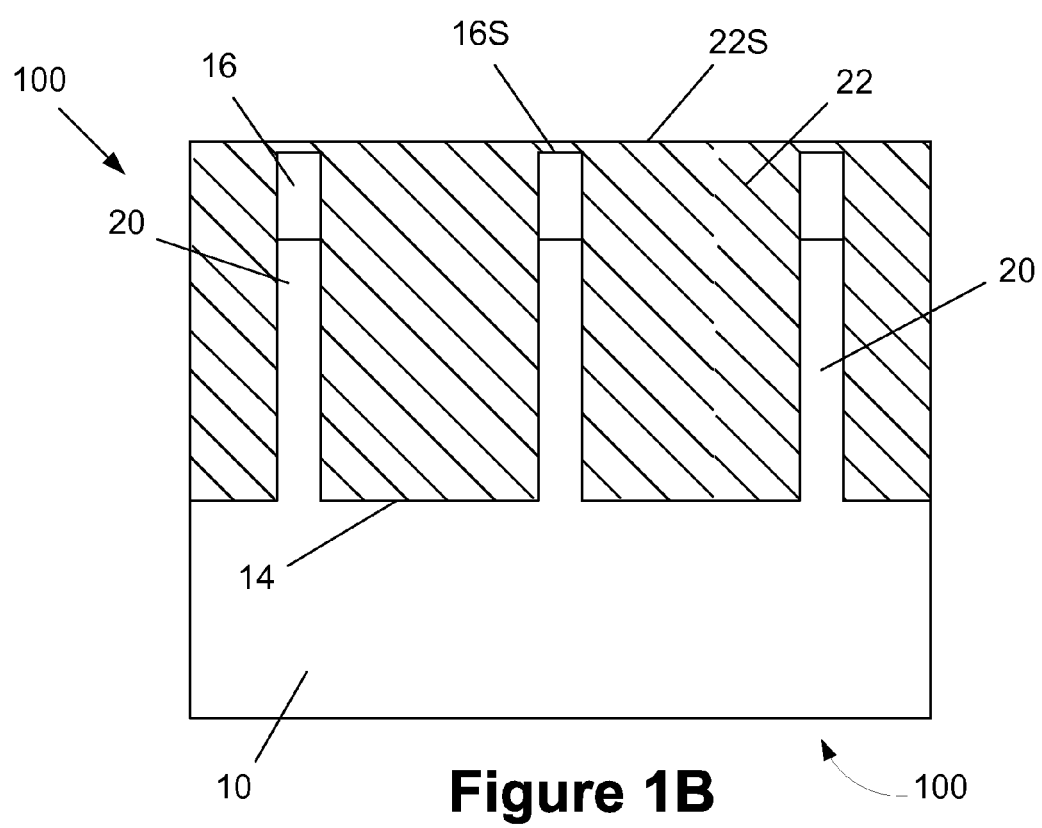

Then, as shown in FIG. 1B, a layer of insulating material 22 is formed in the trenches 14 of the device 100. The layer of insulating material 22 may be comprised of a variety of different materials, such as silicon dioxide, etc., and it may be formed by performing a variety of techniques, e.g., CVD, spin-coating, etc. In one illustrative embodiment, the layer of insulating material 22 may be a flowable oxide material that is formed by performing a CVD process. Such a flowable oxide material is adapted for use with fins 20 of different configurations, even fins 20 with a reentrant profile. In the example depicted in FIG. 1B, the surface 22S of the layer of insulating material 22 is the "as-deposited" surface of the layer 22. In this example, the surface 22S of the layer of insulating material 22 may be positioned slightly above the upper surface 16S of the mask layer 16. Alternatively, if desired, a chemical mechanical polishing (CMP) process may be performed to planarize the surface 22S using the mask layer 16 as a polish-stop layer. After such a CMP process, the surface 22S of the layer of insulating material 22 would be substantially level with the surface 16S of the mask layer 16.

Figure 1C:
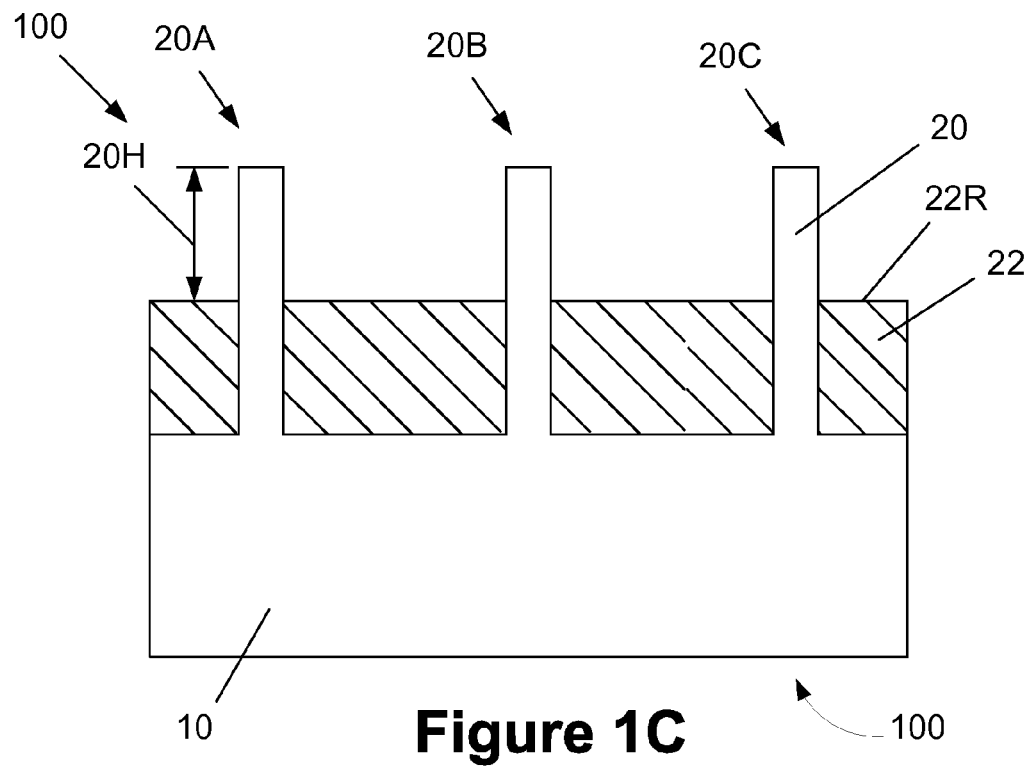

FIG. 1C depicts the device 100 after the layer of insulating material 22 has been recessed and the patterned hard mask 16 has been removed. The recessed layer of insulating material has a recessed surface 22R. The layer of insulating material 22 covers a lower portion of the fins 20 while exposing an upper portion of the fins 20. In the illustrative example depicted herein, the device 100 is comprised of three illustrative fins: 20A, 20B and 20C. Of course, the present invention may be used with any FinFET device having one or more fins. In one example, starting with the device depicted in FIG. 1B, the layer of insulating material 22 may be recessed by simply performing an etching process on the as-deposited layer of insulating material 22. Alternatively, a CMP process may be performed on the layer of insulating material 22 prior to performing such an etching process if desired. The recessed layer of insulating material 22 essentially defines the final fin height 20H of the fins 20. The fin height 20H may vary depending upon the particular application and, in one illustrative embodiment, may range from about 20-50 nm.

Figure 1D:
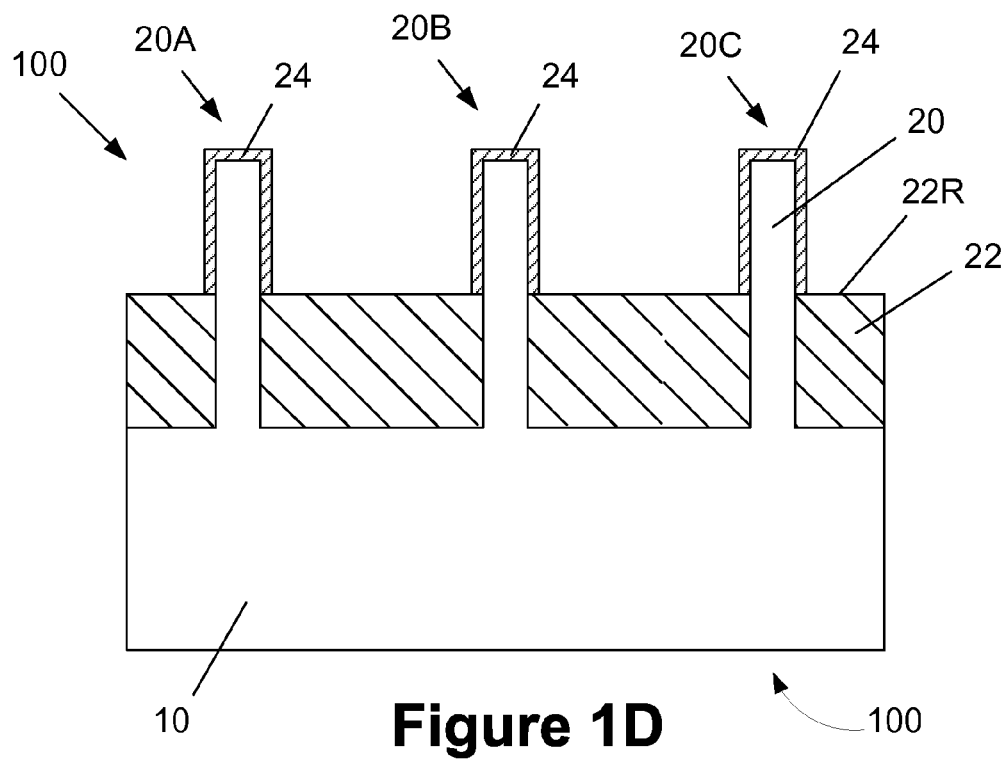

Next, as shown in FIG. 1D, a mask material 24 is formed on the exposed portions of the fins 20. The mask material 24 may be comprised of a variety of different materials, e.g., silicon dioxide, silicon nitride, silicon oxynitride, etc., and the mask material 24 may be formed using a variety of techniques. In one illustrative embodiment, the mask material 24 may be comprised of silicon dioxide and it may be selectively formed on the exposed portions of the fins 20 by performing an oxidation process. In another embodiment, the mask material 24 may be formed by conformably depositing a layer of mask material, forming a patterned etch mask (not shown), and thereafter performing an etching process through the patterned etch mask on the layer of mask material. Thus, the particular manner in which the mask material 24 is formed should not be considered to be a limitation of the present invention unless such limitations are expressly set forth in the attached claims.

Figure 1E:
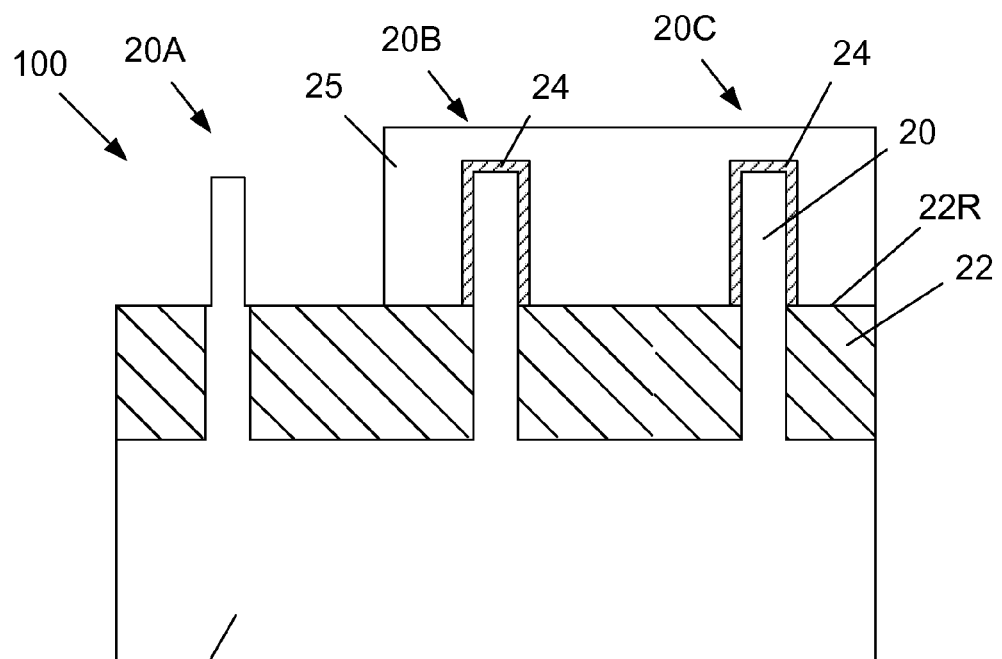

Next, as shown in FIG. 1E, a patterned etch mask 25, e.g., a patterned photoresist mask, is formed on the device 100 that covers the fins 20B, 20C and exposes the fin 20A for further processing. Thereafter, a wet or dry etching process is performed through the patterned etch mask 25 to remove the mask material 24 from above the fin 20A. In effect, the mask material 24 is a mask layer that covers one of more of the bare fins of the device 100 while leaving one or more of the bare fins of the device 100 exposed for further processing. In one illustrative embodiment, the etching process may be a wet etching process so as to limit any damage to the fin 20A. In the case where the mask material 24 was formed by an oxidation process, the removal of the mask material 24 may result in some reduction in the thickness of the fin 20A, as some of the fin 20A is consumed in the oxidation process. In the case where the mask material 24 was formed by performing a deposition process, the size of the fin 20A may be the same as it was when the mask material 24 was originally formed on the bare fin 20A.

Figure 1F:
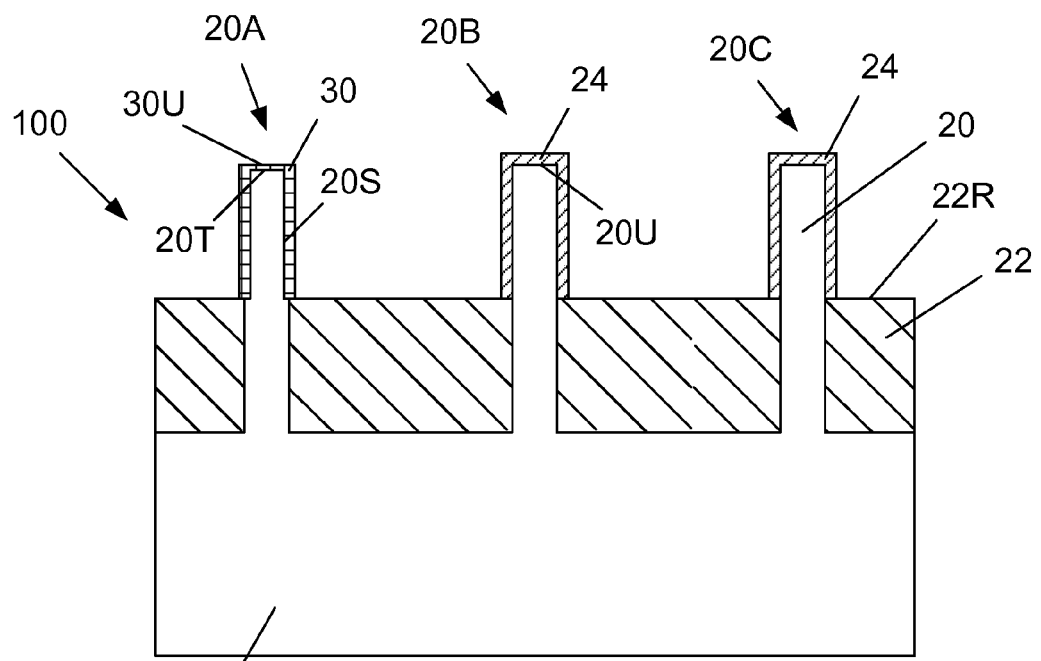

Next, as shown in FIG. 1F, the patterned etch mask 25 is removed and a selective epitaxial growth process is performed to grow a semiconductor material 30 on the exposed fin 20A. The semiconductor material 30 may be comprised of a variety of material, e.g., silicon, silicon-carbon, silicon-germanium, III-V materials, II-VI materials, etc., and it may be either doped (in situ) or un-doped. The thickness of the semiconductor material 30 may vary depending upon the particular application. In one illustrative embodiment, the semiconductor material 30 may have a nominal thickness of about 1-4 nm. In some cases, the semiconductor material 30 may be thinner on the sidewalls 20S of the fin 20A than it is on the upper surface 20T of the fin. For example, in one embodiment, the sidewalls 20S of the fin 20A may have a <110> crystallographic structure, which tends to permit a slower rate of growth of the epitaxial semiconductor material 30, while the upper surface 20T of the fin 20A may have a <100> crystallographic structure, which tends to exhibit a faster rate of growth of the epitaxial semiconductor material 30. If the epitaxial growth process is performed for too long of a duration, the epitaxial layer may likely not be conformal in nature. Rather, in such a situation, the epitaxial material that grows on the sidewall and top of the fins may gradually grow into a generally diamond-like configuration with <111> crystallographic surface structure (not shown in FIG. 1F) because of the slower growth rate occurring on the <111> crystallographic structure. Therefore, if the epitaxial growth process is performed such that the epitaxial semiconductor material 30 is relatively thin, e.g., in the 1-4 nm range, the epitaxial semiconductor material 30 will be nearly conformal as illustrated in FIG. 1F and in later drawings in this application.

Figure 1G:
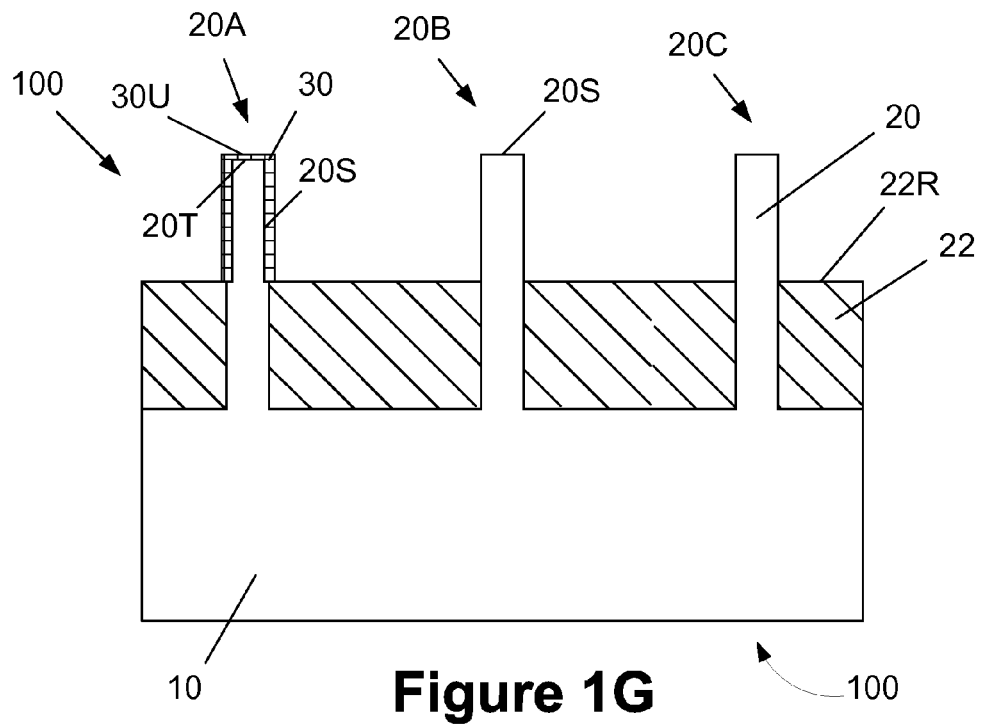
Figure 1H:
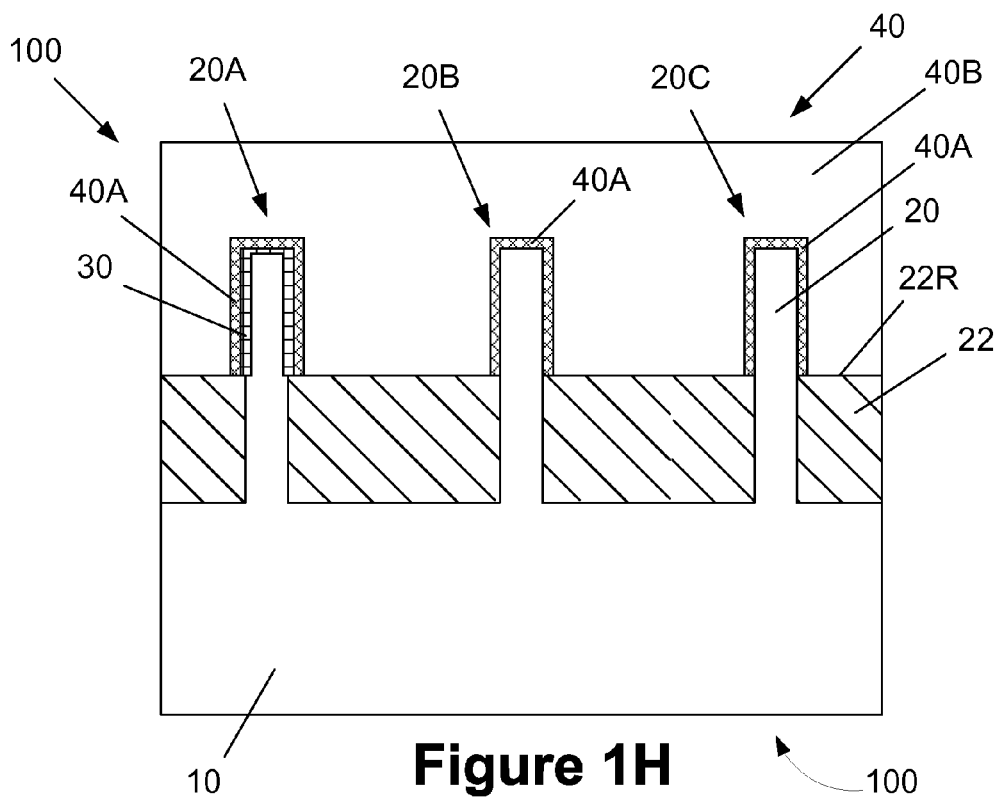
Figure 1I:
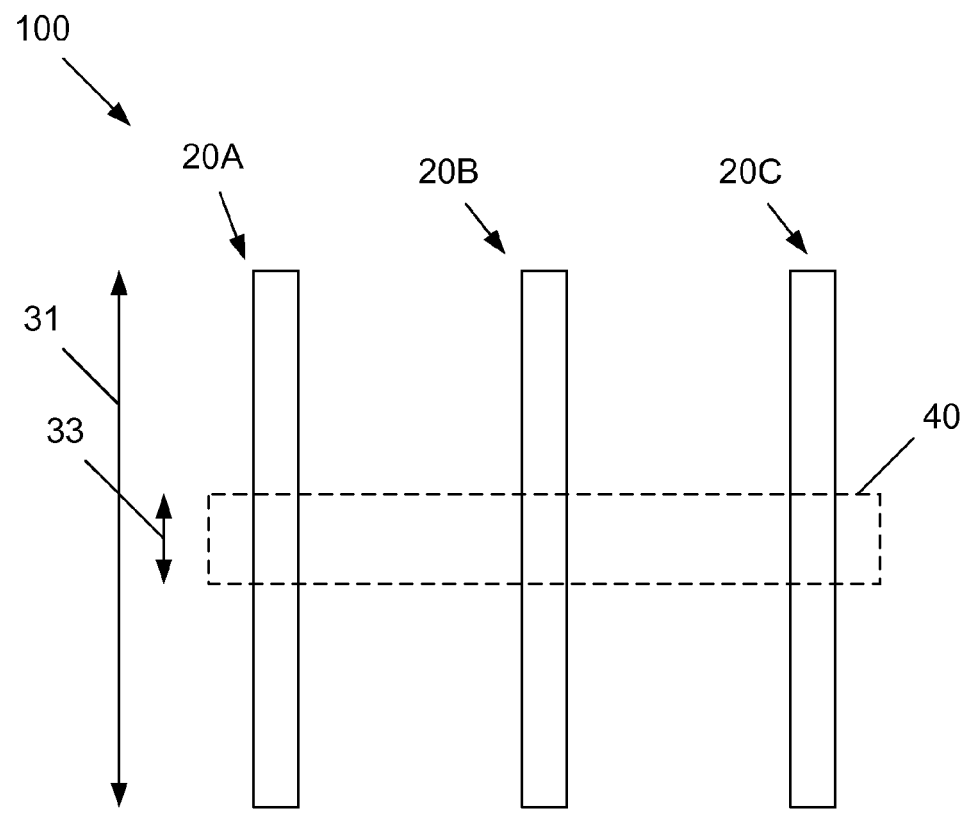

With reference to FIGS. 1F and 1I (which is a partial plan view of the device 100), in one illustrative embodiment, the semiconductor material 30 (not shown in FIG. 1I) covers the entirety of the axial length 31 of the fin 20A. In other cases, another patterned hard mask layer (not shown) may be formed so as to cover the fin 20A except for a portion 33 of the overall axial length 31 where the gate structure 40 (depicted in dashed lines in FIG. 1I) of the device will be formed. That is, in one embodiment, the semiconductor material 30 may be formed on the fin 20A only on the portion of the fin 20A that will underlie the gate structure 40 for the completed device 100. Such a patterned hard mask may be, for example, a layer of silicon nitride (e.g., same as the hard mask 24) that is patterned using traditional photolithography and etching techniques (e.g., using a patterned etch mask like the etch mask 25 depicted in FIG. 1E).

In one illustrative embodiment, the upper surface 30U of the semiconductor material may be approximately level with the upper surface 20U of the original fins 20, e.g., 20B, 20C, to facilitate further downstream processing. In some cases, e.g., where the mask material 24 is formed by an oxidation process, the amount of the fin 20A consumed when the mask material 24 is removed from the fin 20A may provide a sufficient reduction in the height of the fin 20A to allow for the formation of the semiconductor material 30 above the upper surface 20T of the fin 20A. In other embodiments, if desired, a separate etch process may be performed on the exposed fin 20A after the patterned etch mask 25 (see FIG. 1E) is formed to reduce the height of the fin 20A such that, after the semiconductor material 30 is formed, the upper surface 30U of the semiconductor material may be approximately level with the upper surface 20U of the original fins 20.

Next, as shown in FIG. 1G, an etching process is performed to remove the mask material 24 from the fins 20B, 20C. At this point in the process, the illustrative FinFET device 100 may be completed using traditional fabrication techniques. For example, FIG. 1H depicts the device 100 after an illustrative gate structure 40 has been formed for the device 100. In one illustrative embodiment, the schematically depicted gate structure 40 includes an illustrative gate insulation layer 40A and an illustrative gate electrode 40B. The gate insulation layer 40A may be comprised of a variety of different materials, such as, for example, silicon dioxide, a so-called high-k (k greater than 5) insulation material (where k is the relative dielectric constant), etc. Also, the gate insulation layer 40A may be formed conformably on the sidewall and top surface of fins. Similarly, the gate electrode 40B may also be of a material such as polysilicon or amorphous silicon, or it may be comprised of one or more metal layers that act as the gate electrode 40B. As will be recognized by those skilled in the art after a complete reading of the present application, the gate structure 40 of the device 100 depicted in the drawings, i.e., the gate insulation layer 40A and the gate electrode 40B, is intended to be representative in nature. That is, the gate structure 40 may be comprised of a variety of different materials and it may have a variety of configurations, and the gate structure 40 may be made using either the so-called "gate-first" or "gate-last" techniques. In one illustrative embodiment, as shown in FIG. 1H, an oxidation process may be performed to form a gate insulation layer 40A comprised of silicon dioxide. As depicted, the illustrative gate insulation layer 40A is formed on the silicon fins 20B and 20C and on the semiconductor material 30 on the fin 20A. Thereafter, the gate electrode material 40B and a gate capping layer of material (not shown) may be deposited above the device 100 and the layers may be patterned using known photolithographic and etching techniques and planarized by known CMP techniques.

Additionally, each of the fins 20 shown in FIG. 1H may represent one type of fin, e.g., fin 20A for high $V_t$ (N-type), fin 20B for regular $V_t$ (N-type), fin 20C for regular $V_t$ (P-type) in circuits (not shown in FIG. 1H). Also, the gate structure 40 may be different for each type of fin (not shown in FIG. 1I). If desirable for specific applications by the device designer, some circuit blocks may be entirely comprised of the N-type and P-type fins 20B and 20C with regular $V_t$; while another circuit may be composed by the N-type fin 20A (with high $V_t$) and P-type fin 20C (with regular $V_t$). The illustrative one device 100 in FIG. 1H including all different fins (with different $V_t$'s) together is rarely used for digital applications; however, it may be useful for analog applications where the transistor may be linearly turned-on by the gate voltage.

Figure 2A:
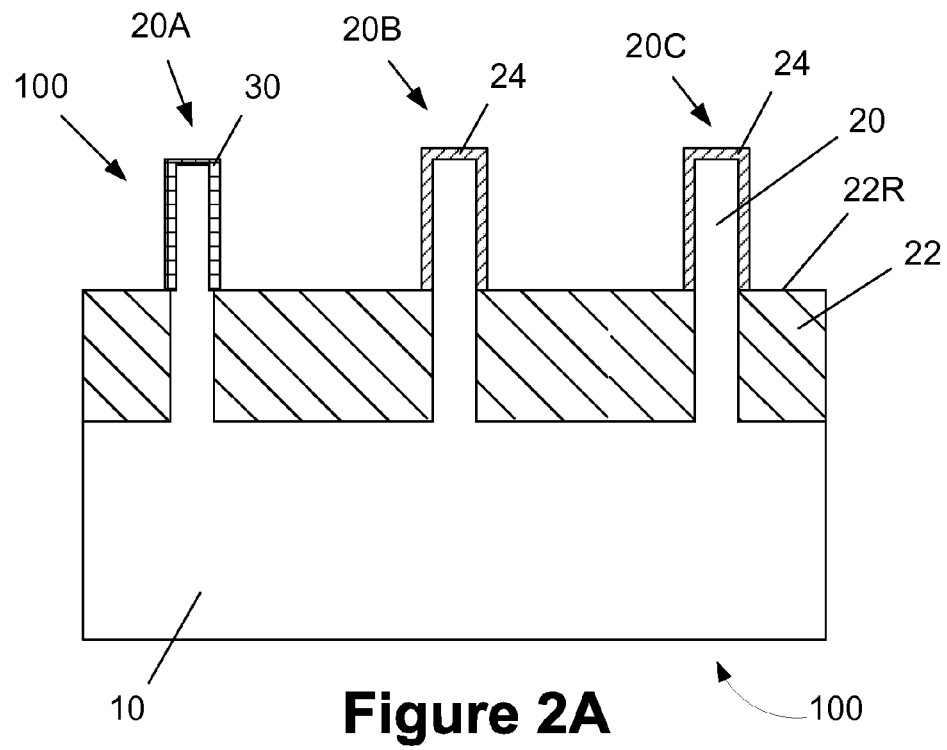

FIGS. 2A-2E depict another illustrative process flow that permits tuning of the threshold voltage of FinFET devices. In FIG. 2A, the FinFET device 100 is depicted at the point of fabrication that corresponds to that described previously with respect to FIG. 1F, i.e., the semiconductor material 30 has been formed on the fin 20A and the mask material 24 is positioned on the fins 20B, 20C.

Figure 2B:
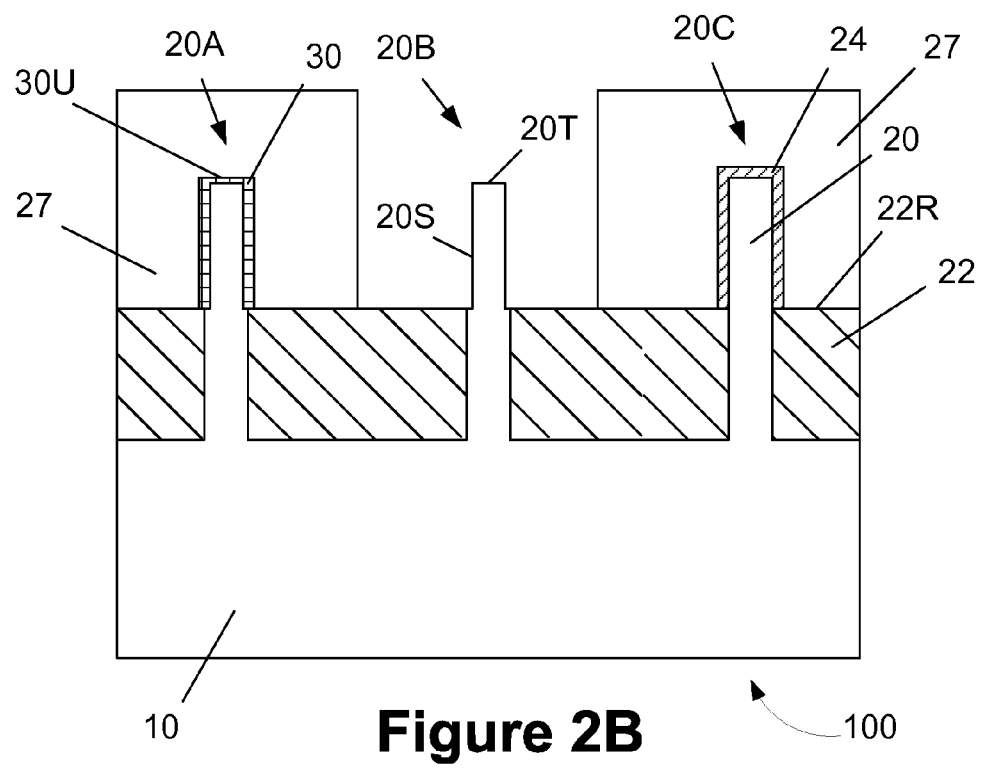

Then, as shown in FIG. 2B, a patterned etch mask 27, e.g., a patterned photoresist mask, is formed on the device 100 that covers the fins 20A, 20C and exposes the fin 20B for further processing. Thereafter, a wet or dry etching process is performed through the patterned etch mask 27 to remove the mask material 24 from above the fin 20B. In one illustrative embodiment, the etching process may be a wet etching process so as to limit any damage to the fin 20B. The previous discussion regarding possible reduction in the size of the fin 20A during the removal of the mask material 24 apply equally to fin 20B.

Next, as shown in FIG. 2C, the patterned etch mask 27 is removed and a selective epitaxial growth process is performed to grow a semiconductor material 32 on the fin 20B and on the semiconductor material 30 that is formed on the fin 20A. The semiconductor material 32 may be comprised of a variety of materials, e.g., silicon, silicon-carbon, silicon-germanium, III-V materials, II-VI materials, etc., and it may be either doped (in situ) or un-doped. In some cases, the semiconductor materials 30 and 32 may be comprised of different semiconductor materials. The thickness of the semiconductor material 32 may vary depending upon the particular application. In one illustrative embodiment, the semiconductor material 32 may have a nominal thickness of about 1-4 nm. As with the semiconductor material 30, in some cases, the semiconductor material 32 may be thicker on the sidewalls 20S of the fin 20B than it is on the upper surface 20T of the fin 20B. As with the semiconductor material 30, in some cases, the semiconductor material 32 covers all of the axial length (into and out of the drawing page) of the fin 20B. In other cases, another patterned hard mask layer (not shown) may be formed so as to cover the fin 20B except for regions where the gate structure (not shown in FIG. 2C) of the device may be formed. That is, in one embodiment, the semiconductor material 32 may be formed on the fin 20B only on the portion of the fin 20B that will underlie the gate structure for the completed device 100. Such a patterned hard mask may be, for example, a layer of silicon nitride that is patterned using traditional photolithography and etching techniques. The previous discussion regarding the desirability of having the upper surfaces of the final fin structures be approximately level applies equally in this embodiment. Thus, the sizing of the fin 20A should take into account that it will have two regions of epitaxial semiconductor material, i.e., semiconductor materials 30 and 32, formed on the fin 20A. Such multi-layer structures of semiconductor materials on one or more of the fins 20 may serve specific desirable applications. For example, the semiconductor material 30 may be employed to introduce a desired stress in the channel region and thereby boost the mobility of carriers (more description in later sections), while the semiconductor material 32 may be employed to provide a band edge offset and to tune the threshold voltage ($V_t$) of the device. As depicted, the fin 20B only has the semiconductor material 32 formed thereon. Of course, using the methods disclosed herein, any desired number of layers of semiconductor material may be formed on one or more fins of a FinFET device.

Figure 2E:
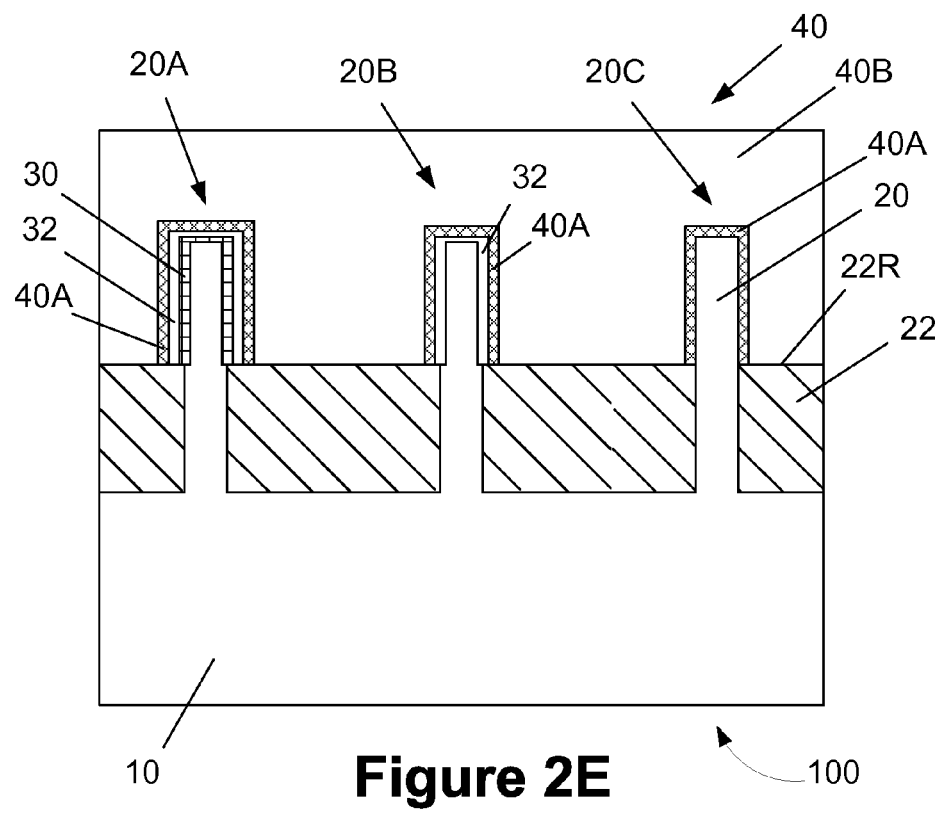

Next, as shown in FIG. 2D, an etching process is performed to remove the mask material 24 from the fin 20C. At this point in the process, the illustrative FinFET device 100 may be completed using traditional fabrication techniques. For example, FIG. 2E depicts the device 100 after the previously-described gate structure 40 has been formed for the device 100. Additionally, each of the fins 20 in FIG. 2E may represent one threshold voltage (V) level type of fin (i.e., low, medium or high V) and they also may be used in either N-type or P-type FinFET devices in various circuit arrangements (not shown in FIG. 2E). Also, the gate structure 40 may be different on each different type of fin, although such a configuration is not required to practice at least some aspects of the present invention. If desirable, for specific applications, some circuit blocks may be entirely composed of FinFET devices having N-type and/or P-type fins like the illustrative fin 20A, while another circuit may be composed of FinFET devices having N-type fins 20B, and FinFET devices having P-type fins 20C, etc., or any combination. The illustrative device 100 in FIG. 2E including all different fins (with different $V_t$'s) together is rarely used for today's digital applications, however, such a configuration may be useful for analog applications where the transistor is "linearly" turned-on by the gate voltage. Furthermore, a device 100 with multiple fins with different threshold voltage levels may be employed to implement the multi-value logic circuit by the turn-on of fins digitally in responding to multiple discrete levels of the gate voltage.

In another illustrative aspect of the subject matter disclosed herein, the semiconductor material 30 and/or the semiconductor material 32 may be provided with a desired stress profile to enhance the performance of the FinFET device. For example, in the case of an N-type FinFET, the added semiconductor material may have a tensile stress to thereby enhance the mobility of electrons for the N-type FinFET device. In the case of a P-type FinFET, the added semiconductor material may have a compressive stress to thereby enhance the mobility of holes for the P-type FinFET device. The manner in which such semiconductor materials are epitaxially grown so as to exhibit the desired stress levels are well known to those skilled in the art.

Figure 3A:
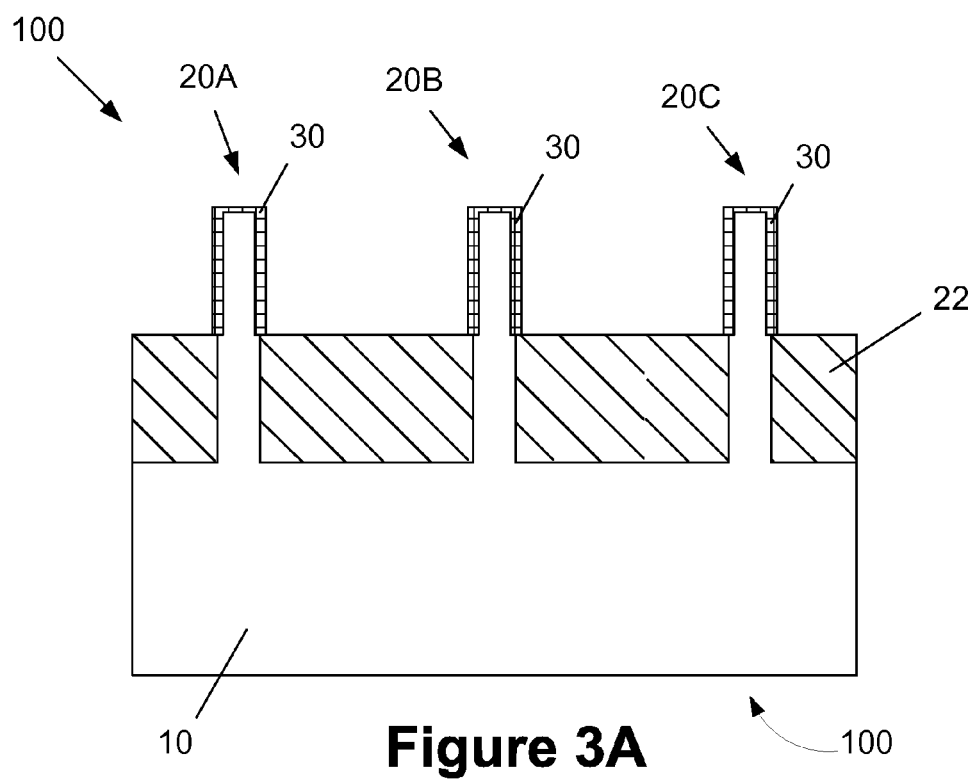
FIGS. 3A-3B depict various illustrative devices that may be formed using the methods disclosed herein.

By use of the novel methods disclosed herein, FinFET devices with novel fin structures may be formed. For example, FIG. 3A depicts an illustrative 3-fin FinFET device 100 wherein the semiconductor material 30 has been formed on all of the fins (20A-20C) of the device. In a more specific application, in an N-type FinFET device, all of the fins of such a device may have a semiconductor material comprised of silicon carbon formed on the silicon fins to enhance electron mobility. As another example, in a P-type FinFET, all of the fins of such a device may have a single semiconductor material (like the single layer of semiconductor material 30 shown on the fins in FIG. 3A) comprised of silicon-germanium formed on the fins to enhance hole mobility.

Figure 3B:
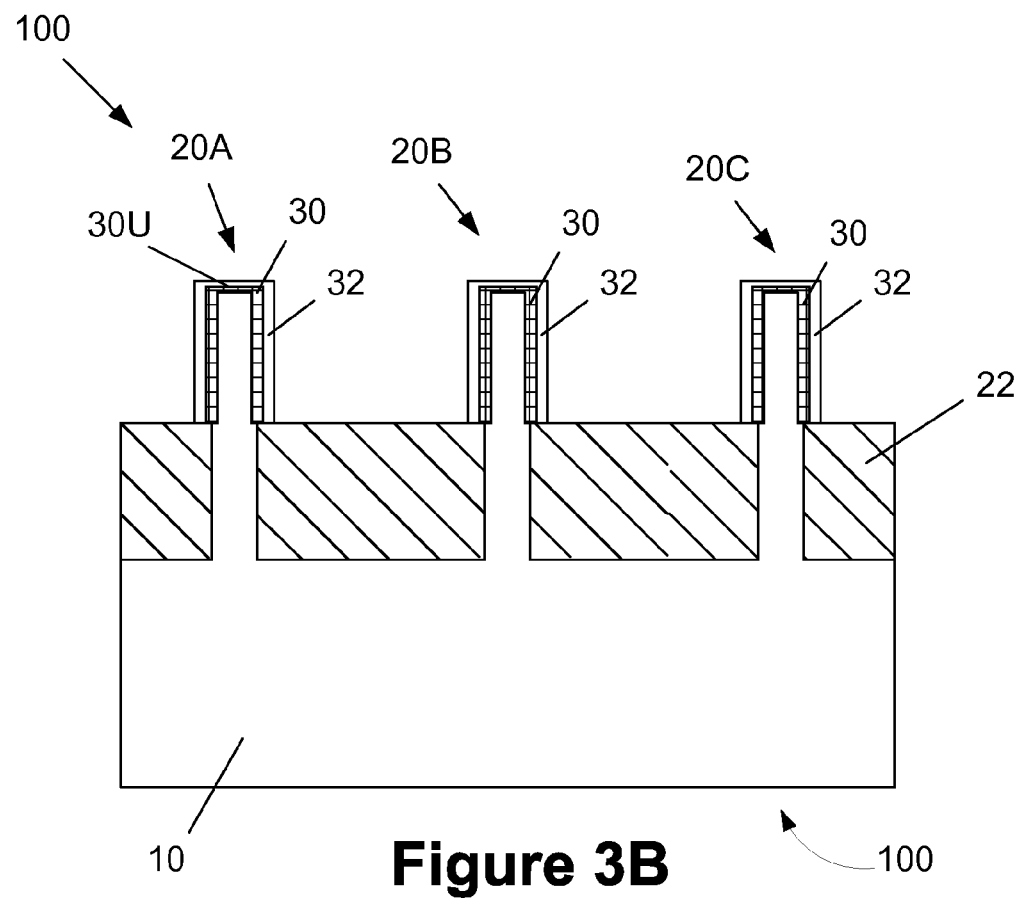

FIG. 3B depicts another illustrative 3-fin FinFET device 100 wherein multiple layers of semiconductor material, e.g., the semiconductor material 30 and the semiconductor material 32 have been formed on all of the fins (20A-20C) of the device. As a more specific example, where the device depicted in FIG. 3B is a P-type FinFET device, wherein the bare fins are comprised of silicon, the semiconductor material 30 may be comprised of silicon-germanium and the semiconductor material 32 may be comprised of silicon.

In general, for devices where an increased threshold voltage is desired, additional semiconductor material may be added to the bare fin(s) of the device. That is, the threshold voltage of the device may be adjusted by the band-edge offset between the added semiconductors material(s) with respect to the original fin material of the device using the selective epitaxial growth methods disclosed herein. Further, the layer or multiple layers of semiconductor materials added to the original fin material can increase the threshold voltage tuning range by the total amount of band-edge offset. Additionally, the added semiconductor materials may be provided with desired stress profiles for enhancing the performance to the FinFET devices in addition to the band-edge offset.

In other embodiments, the methods disclosed herein permit the formation of FinFET devices wherein one or both of the semiconductor materials 30, 32 (and perhaps additional semiconductor materials) may be formed on some but not all of the fins of the device. For example, the device depicted in FIG. 1G may be a 3-fin N-type FinFET device, wherein the semiconductor material 30, e.g., silicon-carbon, is formed only on the fin 20A, while the fins 20B-20C remain as bare silicon fins. As yet another example, the device depicted in FIG. 1G may be a 3-fin P-type FinFET device, wherein the semiconductor material 30, e.g., silicon-germanium, is formed only on the fin 20A, while the fins 20B-20C remain as bare silicon fins. In other cases, the additional semiconductor material 32, e.g., silicon, may be formed on the fin 20A depicted in FIG. 1G, while the fins 20B-20C remain as bare fins.

In another embodiment, where the device depicted in FIG. 2D is a P-type FinFET device, one of the fins, e.g., fin 20B, may only have a single layer of semiconductor material, e.g., semiconductor material 30, while another fin, e.g., 20A, may have multiple layers of semiconductor material, e.g., semiconductor materials 30 and 32, formed thereon.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a FinFET device, comprising:
   forming a plurality of spaced-apart trenches in a semiconducting substrate, said trenches defining at least one fin comprised of said semiconducting substrate for said device;
   forming a layer of insulating material in said trenches, wherein an upper portion of said at least one fin extends above an upper surface of said layer of insulating material so as to expose all sidewall surfaces and an entirety of a top surface of said upper portion of said at least one fin;
   after forming said layer of insulating material, forming a conformal mask layer on all of said exposed sidewall and top surfaces of said upper portion of said at least one fin, wherein an exposed surface of said conformal mask layer conforms to a shape of said upper portion of said at least one fin;
   removing said conformal mask layer from said upper portion of said at least one fin so as to re-expose all of said sidewall and top surfaces of said upper portion;
   after removing said conformal mask layer and prior to forming a gate structure above said at least one fin, performing a first epitaxial growth process to grow a first semiconductor material at least at a location on said re-exposed upper portion of said at least one fin where at least a portion of said gate structure will be formed thereabove; and
   forming said gate structure above said first semiconductor material on said at least one fin.

2. The method of claim 1, further comprising, after forming said first semiconductor material, but prior to forming said gate structure, performing a second epitaxial growth process to form a second semiconductor material on said first semiconductor material.

3. The method of claim 1, wherein said FinFET device is an N-type FinFET device and wherein said first semiconductor material is comprised of silicon-carbon.

4. The method of claim 1, wherein said FinFET device is a P-type FinFET device and wherein said first semiconductor material is comprised of silicon-germanium.

5. The method of claim 2, wherein said FinFET device is a P-type FinFET device and wherein said first semiconductor material is comprised of silicon-germanium and said second semiconductor material is comprised of silicon.

6. The method of claim 1, wherein said semiconducting substrate is comprised of silicon.

7. The method of claim 1, wherein said first semiconductor material is comprised of silicon, silicon-carbon, silicon-germanium, a III-V compound or a II-VI compound.

8. The method of claim 2, wherein said second semiconductor material is comprised of silicon, silicon-carbon, silicon-germanium, a III-V compound or a II-VI compound.

9. The method of claim 1, wherein said first semiconductor material extends along an entire axial length of said at least one fin.

10. The method of claim 2, wherein said second semiconductor material extends along an entire axial length of said at least one fin.

11. The method of claim 1, wherein said device comprises a plurality of fins and wherein said first semiconductor material is formed on all of the fins in said device.

12. The method of claim 11, wherein, after forming said first semiconductor material on all of the fins in said device, but prior to forming said gate structure, performing a second epitaxial growth process to form a second semiconductor material on said first semiconductor material on all of said fins.

13. The method of claim 2, wherein said second semiconductor material is formed at least at a location on said at least one fin where at least a portion of said gate structure will be formed thereabove.

14. The method of claim 1, wherein forming said layer of insulating material comprises:

performing a deposition process to form said layer of insulating material to a thickness such that it overfills said trenches; and performing an etching process to reduce said thickness of said layer of insulating material such that an upper surface of said layer of insulating material is positioned at a level that is below a level of an upper surface of said at least one fin.

15. A method of forming a FinFET device, comprising:

forming a plurality of spaced-apart trenches in a semiconducting substrate, said trenches defining a plurality of fins comprised of said semiconducting substrate for said device;

forming a layer of insulating material in said trenches, wherein an upper portion of each of said plurality of fins extends above an upper surface of said layer of insulating material so that all surfaces of said upper portions are exposed;

after forming said layer of insulating material, forming a conformal mask layer on said all exposed surfaces of said upper portion of each of said plurality of fins;

removing said conformal mask layer from a respective upper portion of at least a first one of said plurality of fins so as to re-expose said all surfaces of said respective upper portion of said at least said first one of said plurality of fins;

after re-exposing said all surfaces of said respective upper portion of said at least said first one of said plurality of fins and prior to forming a gate structure above said plurality of fins, performing a first epitaxial growth process to grow a first semiconductor material on at least a portion of each of said plurality of fins, wherein said first semiconductor material is formed at least at a location on each of said plurality of fins where at least a portion of said gate structure will be formed thereabove; and forming said gate structure above said first semiconductor material.

16. The method of claim 15, wherein said first semiconductor material extends along an entire axial length of each of said plurality of fins.

17. A method of forming a FinFET device, comprising:

forming a plurality of spaced-apart trenches in a semiconducting substrate, said trenches defining a plurality of fins comprised of said semiconducting substrate for said device;

forming a layer of insulating material in said trenches, wherein an upper portion of each of said plurality of fins extends above an upper surface of said layer of insulating material so that all surfaces of said upper portions are exposed;

after forming said layer of insulating material, forming a conformal mask layer on said all exposed surfaces of said upper portion of each of said plurality of fins;

selectively removing said conformal mask layer from a respective upper portion of a first one of said plurality of fins so as to re-expose said all surfaces of said respective upper portion of said first one of said plurality of fins;

prior to forming a gate structure above said plurality of fins, performing a first epitaxial growth process to grow a first semiconductor material on at least a portion of said re-exposed surfaces of said first one of said plurality of fins, wherein said first semiconductor material is formed at least at a location on said first one of said plurality of fins where at least a portion of said gate structure will be formed thereabove;

after performing said first epitaxial growth process, selectively removing said conformal mask layer from a respective upper portion of a second one of said plurality of fins so as to re-expose said all surfaces of said respective upper portion of said second one of said plurality of fins;

performing a second epitaxial growth process to grow a second semiconductor material on at least a portion of said re-exposed surfaces of said second one of said plurality of fins and said first semiconductor material on said first one of said plurality of fins; and after performing said first and second epitaxial growth processes, forming said gate structure above said first and second semiconductor materials.

18. The method of claim 17, wherein said first semiconductor material extends along an entire axial length of at least said first one of said plurality of fins.

19. The method of claim 18, wherein said second semiconductor material extends along an entire axial length of at least said first one and said second one of said plurality of fins.

20. A method of forming a FinFET device, comprising:

forming a plurality of spaced-apart trenches in a semiconducting substrate, said trenches defining a plurality of fins comprised of said semiconducting substrate for said device;

forming a layer of insulating material in said trenches, wherein an upper portion of each of said plurality of fins extends above an upper surface of said layer of insulating material so that all surfaces of said upper portions are exposed;

after forming said layer of insulating material, forming a conformal hard mask layer that covers said all surfaces of a respective upper portion of at least a first one of said plurality of fins but leaves said all surfaces of a respective upper portion of at least a second one of said plurality of fins exposed for further processing, wherein said conformal hard mask layer is formed on and in direct contact with said all surfaces of said respective upper portion of said at least said first one of said plurality of fins and an exposed surface of said conformal hard mask layer conforms to a shape of said respective upper portion of said at least said first one of said plurality of fins; and performing a first epitaxial growth process in the presence of said conformal hard mask layer to grow a first semiconductor material on said all surfaces of said at least said second one of said plurality of fins exposed for further processing, said first semiconductor material extending along an entire axial length of said at least said second one of said plurality of fins.

21. The method of claim 20, further comprising performing a second epitaxial growth process through said conformal hard mask layer to form a second semiconductor material on said first semiconductor material.

22. The method of claim 21, wherein said second semiconductor material extends along an entire axial length of said at least said second one of said plurality of fins.

23. The method of claim 20, wherein forming said conformal hard mask layer comprises:

performing an oxidation process to selectively form an oxidized mask material on said all surfaces of said upper portion of each of said plurality of fins;

after performing said oxidation process, forming a patterned etch mask layer above said plurality of fins that covers said at least said first one of said plurality of fins but leaves at least said second one of said plurality of fins exposed for further processing; and performing an etching process through said patterned etch mask to selectively remove said oxidized mask material from said at least said second one of said plurality of fins.

24. The method of claim 20, wherein forming said conformal hard mask layer comprises:
   performing a deposition process to deposit a mask material on said all surfaces of said upper portion of each of said plurality of fins;
   after performing said deposition process, forming a patterned etch mask layer above said plurality of fins that covers said at least said first one of said plurality of fins but leaves at least said second one of said plurality of fins exposed for further processing; and
   performing an etching process through said patterned etch mask to selectively remove said deposited mask material from said at least said second one of said plurality of fins.

25. The method of claim 1, wherein forming said conformal mask layer comprises performing an oxidation process.

26. The method of claim 1, wherein forming said conformal mask layer comprises depositing a conformal layer of mask material.

27. The method of claim 1, wherein said plurality of spaced-apart trenches define at least one additional fin, an upper portion of said at least one additional fin extending above said upper surface of said layer of insulating material so as to expose all sidewall surfaces and an entirety of a top surface of said upper portion of said at least one additional fin, the method further comprising:
   forming said conformal mask layer on all of said exposed sidewall and top surfaces of said upper portion of said at least one additional fin;
   leaving said conformal mask layer on said all exposed surfaces of said upper portion of said at least one additional fin while removing said conformal mask layer from said upper portion of said at least one fin; and
   leaving said conformal mask layer on said all exposed surfaces of said upper portion of said at least one additional fin while performing said first epitaxial growth process to grow said first semiconductor material on said at least said portion of said re-exposed surfaces of said upper portion of said at least one fin.

28. The method of claim 15, wherein forming said conformal mask layer comprises performing an oxidation process.

29. The method of claim 15, wherein forming said conformal mask layer comprises depositing a conformal layer of mask material.

30. The method of claim 15, wherein removing said conformal mask layer from said respective upper portion of said at least said first one of said plurality of fins comprises leaving said conformal mask layer on a respective upper portion of at least a second one of said plurality of fins.

31. The method of claim 17, wherein forming said conformal mask layer comprises performing an oxidation process.

32. The method of claim 17, wherein forming said conformal mask layer comprises depositing a conformal layer of mask material.

33. A method of forming a FinFET device, comprising:
   forming a plurality of spaced-apart trenches in a semiconducting substrate, said trenches defining at least one fin comprised of said semiconducting substrate for said device;
   forming a layer of insulating material in said trenches, wherein an upper portion of said at least one fin extends above an upper surface of said layer of insulating material so as to expose all sidewall surfaces and an entirety of a top surface of said upper portion of said at least one fin;
   after forming said layer of insulating material, forming a conformal mask layer on all of said exposed sidewall and top surfaces of said upper portion of said at least one fin;
   removing said conformal mask layer from said upper portion of said at least one fin so as to re-expose all of said sidewall and top surfaces of said upper portion;
   after removing said conformal mask layer and prior to forming a gate structure above said at least one fin, performing a first epitaxial growth process to grow a first semiconductor material at least at a location on said re-exposed upper portion of said at least one fin where at least a portion of said gate structure will be formed thereabove; and
   forming said gate structure above said first semiconductor material on said at least one fin.

34. A method of forming a FinFET device, comprising:
   forming a plurality of spaced-apart trenches in a semiconducting substrate, said trenches defining a plurality of fins comprised of said semiconducting substrate for said device;
   forming a layer of insulating material in said trenches, wherein an upper portion of each of said plurality of fins extends above an upper surface of said layer of insulating material so that all surfaces of said upper portions are exposed;
   after forming said layer of insulating material, forming a conformal hard mask layer that covers said all surfaces of a respective upper portion of at least a first one of said plurality of fins but leaves said all surfaces of a respective upper portion of at least a second one of said plurality of fins exposed for further processing; and
   performing a first epitaxial growth process in the presence of said conformal hard mask layer to grow a first semiconductor material on said all surfaces of said at least said second one of said plurality of fins exposed for further processing, said first semiconductor material extending along an entire axial length of said at least said second one of said plurality of fins.

35. The method of claim 34, further comprising performing a second epitaxial growth process through said hard mask layer to form a second semiconductor material on said first semiconductor material, wherein said second semiconductor material extends along said entire axial length of said at least said second one of said plurality of fins.

36. A method of forming a FinFET device, comprising:
   forming a plurality of spaced-apart trenches in a semiconducting substrate, said trenches defining a plurality of fins comprised of said semiconducting substrate for said device;
   forming a layer of insulating material in said trenches, wherein an upper portion of each of said plurality of fins extends above an upper surface of said layer of insulating material so that all surfaces of said upper portions are exposed;
   after forming said layer of insulating material, forming a conformal hard mask layer that covers said all surfaces of a respective upper portion of at least a first one of said plurality of fins but leaves said all surfaces of a respective upper portion of at least a second one of said plurality of fins exposed for further processing;
   performing a first epitaxial growth process in the presence of said conformal hard mask layer to grow a first semiconductor material on said all surfaces of said at least said second one of said plurality of fins exposed for further processing; and performing a second epitaxial growth process through said conformal hard mask layer to form a second semiconductor material on said first semiconductor material, said second semiconductor material extending along an entire axial length of said at least said second one of said plurality of fins.

\* \* \* \* \*